United States Patent [19]
Silva et al.

[11] Patent Number: 5,764,488
[45] Date of Patent: Jun. 9, 1998

[54] PRINTED CIRCUIT BOARD HAVING A DUAL PATTERN FOOTPRINT FOR RECEIVING ONE OF TWO COMPONENT PACKAGES

[75] Inventors: David J. Silva, Trabuco Canyon; Mitchell G. Dorfmeyer, Corona, both of Calif.

[73] Assignee: AST Research, Inc., Irvine, Calif.

[21] Appl. No.: 661,617

[22] Filed: Jun. 11, 1996

[51] Int. Cl.$^6$ .................................... H05K 1/11
[52] U.S. Cl. .................. 361/777; 361/760; 361/796; 361/803; 361/779; 361/748; 361/785; 439/74; 439/60; 439/64; 439/65; 439/91; 439/591; 439/61; 439/59; 257/723; 257/724
[58] Field of Search ..................... 361/777, 760, 361/796, 803, 779, 748, 785; 439/74, 60, 64, 65, 91, 591, 61, 59; 257/723, 724, 786

[56] References Cited

U.S. PATENT DOCUMENTS

| | | | |
|---|---|---|---|
| 4,511,950 | 4/1985 | Bunner et al. | 361/788 |
| 4,530,002 | 7/1985 | Kanai | 357/68 |
| 4,840,570 | 6/1989 | Mann, Jr. et al. | 439/74 |
| 5,064,378 | 11/1991 | Olson et al. | 439/68 |
| 5,159,536 | 10/1992 | Siverio | 361/760 |
| 5,258,890 | 11/1993 | de Veer | 361/783 |
| 5,386,346 | 1/1995 | Gleadall | 361/799 |
| 5,557,505 | 9/1996 | Silva | 361/777 |
| 5,571,996 | 11/1996 | Swamy et al. | 174/261 |

FOREIGN PATENT DOCUMENTS

| | | |
|---|---|---|
| 0171232 | 7/1985 | European Pat. Off. |
| 0246088 | 5/1987 | European Pat. Off. |
| 2170047 | 1/1986 | United Kingdom |
| 2233823 | 11/1990 | United Kingdom |

*Primary Examiner*—Leo P. Picard
*Assistant Examiner*—David Foster
*Attorney, Agent, or Firm*—Knobbe, Martens, Olson & Bear, LLP

[57] ABSTRACT

A printed circuit board having a footprint that is capable of receiving one of two electronic components having differing pin configurations. The footprint includes a first and a second common pin receptor arranged about a first axis. The first and second common pin receptors are configured to receive a first and a second pin on either of the electronic components. The footprint also includes a third pin receptor that is positioned along the first axis so as to be interposed between the first and the second common pin receptors and is configured to receive a third pin receptor of the first electronic component. The footprint also includes a fourth pin receptor that is positioned along a second axis, that is orthogonal to and intersects the first axis at the location of the third pin receptor. The fourth pin receptor is configured to receive a third pin of the second electronic component. In one embodiment, the electronic components are surface mount EMI filters and the third and fourth pin receptors are electrically connected. Hence, electronic components having three pins that have two different configurations can be accommodated in the same footprint.

24 Claims, 3 Drawing Sheets

PRINTED CIRCUIT BOARD HAVING A DUAL PATTERN FOOTPRINT FOR RECEIVING ONE OF TWO COMPONENT PACKAGES

BACKGROUND OF THE INVENTION

1. Field of the Invention

The present invention generally relates to printed circuit boards and, more particularly, concerns a printed circuit board having a pattern of pin receptors, known as a footprint, that is capable of receiving one of two different electronic component packages on substantially the same location of the printed circuit board.

2. Description of the Related Art

Personal computers typically include a number of printed circuit boards, which have a plurality of electronic components mounted thereon, to provide the personal computer with its function. The electronic components include integrated circuits and also discrete electronic components that perform specific functions. For example, filters, such as noise suppression filters, are often mounted on the printed circuit boards that are used in computers. Generally, a printed circuit board has a plurality of pin receptors arranged in a pattern, known as a footprint, which is configured to receive the pins of the package of the electronic component when the package is mounted on the board. The pin receptors are then electrically connected to conductive traces formed in or on the board which interconnect different components mounted on the board.

One difficulty that manufacturers of computers have is that different component manufacturers produce components that perform substantially the same function, but have different pin configurations. Consequently, the printed circuit board manufacturer must design a printed circuit board with a particular manufacturer's component in mind. In the event that the printed circuit board manufacturer wishes to use an equivalent component from a competing manufacturer that uses a different package having a different configuration of pins, the printed circuit board manufacturer must redesign the printed circuit board to accommodate the component that has the different configuration of pins.

It will be appreciated that redesigning a printed circuit board for different configurations of components can be expensive for the printed circuit board manufacturer, particularly with complex multi-layer printed circuit boards. As an example, there are a variety of different manufacturers that manufacture noise suppression filters. A typical noise suppression filter comprises two inductors in series and a capacitor coupled between the two inductors and ground. Typically, these types of filters from differing manufacturers have the same or equivalent circuit configuration but are often in different packages that have different pin configurations. Consequently, the printed circuit board manufacturer must select a filter and design the board using the selected filter with the selected pin configuration. However, this prevents the manufacturer from periodically purchasing compatible components from other suppliers without having to redesign the printed circuit board.

Hence, there is a need for a printed circuit board which will allow a manufacturer to accommodate components that perform the same function but have different packages and different pin configurations. It will be appreciated, however, that if multiple footprints of pin receptors are provided on the circuit board, a substantial amount of space on the board may be wasted. This can result in increased manufacturing costs and may result in the printed circuit board exceeding its surface area design constraints. This problem would be particularly accentuated in applications such as lap top computers, wherein space on the surface of the printed circuit board is at a premium.

Thus, there is a need for a footprint configuration for a printed circuit board that would be capable of accommodating more than one component that performs the same function. In particular, there is a need for a footprint that is capable of receiving one of two different component packages for EMI noise suppression surface mount devices that would not take up unnecessary space on the printed circuit board as this is a commonly used device on many printed circuit boards for which there are competing manufacturers producing functionally equivalent components that are in different component packages.

SUMMARY OF THE INVENTION

The aforementioned needs are satisfied by the printed circuit board of the present invention which includes a first common pin receptor and a second common pin receptor that are arranged along a first axis on the printed circuit board, a third pin receptor interposed between the first and second common pin receptors along the first axis and a fourth pin receptor which is positioned along a second axis, which is orthogonal to the first axis and intersects the first axis at the location of the third pin receptor, so that the fourth pin receptor is spaced from the third pin receptor. The third and fourth pin receptors are preferably connected via a conductive trace that is formed in or on the printed circuit board.

Preferably, the first, second and third pin receptors are configured to receive the pins of a first component package. Similarly, the first, second and fourth pin receptors are also configured to receive the pins of a second chip package. In the preferred embodiment, the first, second and third pins are configured so as to receive and make electrical contact with an EMI suppression surface mount filter and, in particular, an NFM 51R-type series filter manufactured by Murata Erie Corp. of Japan. Similarly, the first, second and fourth pin receptors are configured to receive a chip package containing a different EMI surface mount filter. Specifically, the first, second and fourth pin receptors are configured to receive a ZJSM-type filter manufactured by the RFI Filter Division of TDK of Japan.

The footprint of the preferred embodiment allows for one of two different types of EMI suppression surface mount filters to be mounted in substantially the same location on a printed circuit board. This allows for greater flexibility for the manufacturer of the printed circuit board when purchasing components from suppliers while minimizing the amount of additional space that must be utilized to form the footprint to accommodate the component. These and other objects and advantages of the present invention will become more fully apparent from the following description taken in conjunction with the accompanying drawings.

DETAILED DESCRIPTION OF THE PREFERRED EMBODIMENT

Figure 1:
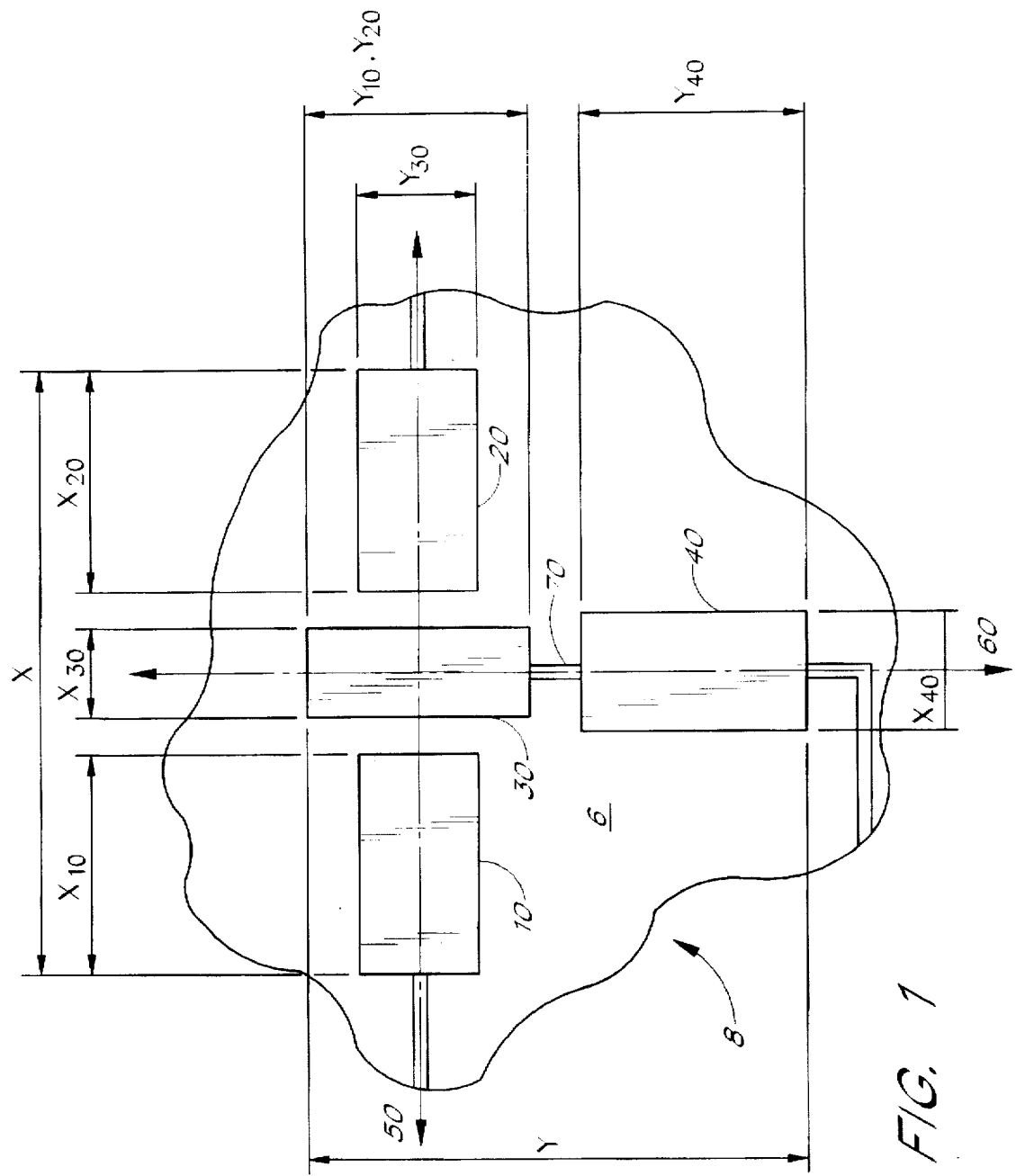
FIG. 1 is a top view of a portion of a printed circuit board having a preferred plurality of pin receptors configured and positioned to receive one of two SMD-type EMI filters.

Reference will now be made to the drawings wherein like numerals refer to like parts throughout. FIG. 1 illustrates a top view of a footprint 8 of pin receptors of the preferred embodiment that is formed on a portion of a printed circuit board 6 and is configured to receive one of two SMD-type EMI filters. The footprint 8 comprises a first common pin receptor 10, a second common pin receptor 20, a third pin receptor 30 and a fourth pin receptor 40. The pin receptor 10 and the pin receptor 20 in the preferred embodiment are centered about and extend longitudinally along an axis 50. The pin receptor 30 is interposed between the pin receptors 10 and 20 and is centered about and extends longitudinally along an axis 60 that is perpendicular to the axis 50. Preferably, the intersection of the axis 50 and the axis 60 occurs at substantially the geographic center of the pin receptor 30. The pin receptor 40 is also centered about and extends longitudinally along the axis 60 and is spaced a distance from the pin receptor 30. The pin receptors 30 and 40 are interconnected via a conductive trace 70 that is formed either on the top surface of the printed circuit board 6 or in one of the underlying layers of the printed board 6 in a well-known manner.

The exact dimensions of the pin receptors 10, 20, 30 and 40 are configured so as to receive pins on one of two different types of electronic components. Specifically, the pin receptors of the footprint 8 are spaced and sized so as to receive the pins on both NFM 51R-type series surface mount EMI suppression filter 25 (FIG. 2) available from the Murata Erie Corp. of Japan and a ZJSM-type EMI surface mount filter 35 (FIG. 3) available from the RFI Filter Division of TDK Corp. of Japan. Table I below summarizes the planar dimensions of the plurality of pin receptors comprising the footprint 8 of the preferred embodiment.

TABLE I

| Dimensions: | |
| --- | --- |
| x | .212 inches |
| y | .145 inches |
| $x_{10}$ | .080 inches |
| $y_{10}$ | .040 inches |
| $x_{20}$ | .080 inches |
| $y_{20}$ | .040 inches |
| $x_{30}$ | .025 inches |
| $y_{30}$ | .070 inches |
| $x_{40}$ | .040 inches |
| $y_{40}$ | .060 inches |

Figure 2:
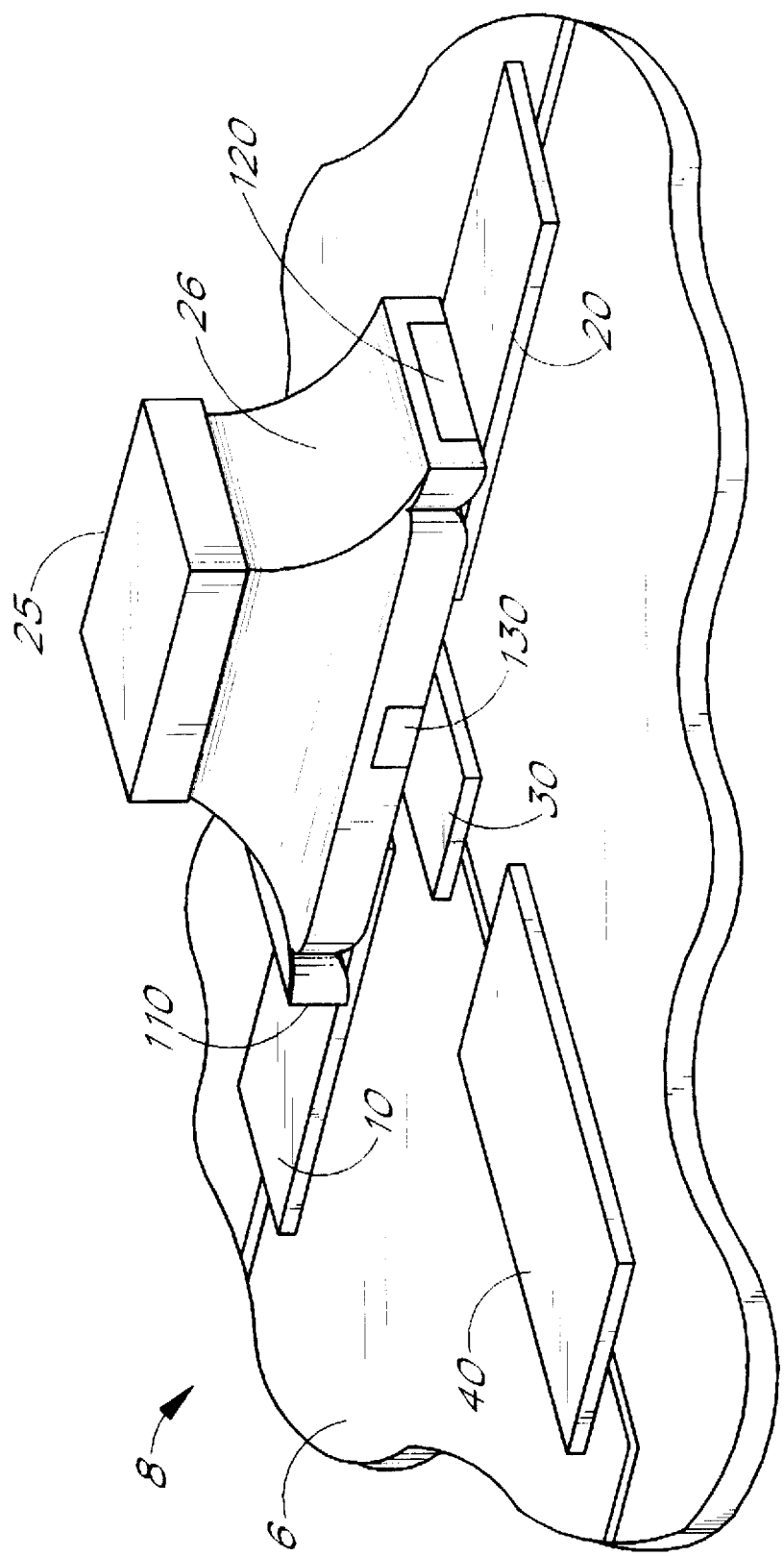
FIG. 2 is a perspective view of the printed circuit board portion of FIG. 1 wherein a first component package containing an SMD-type EMI filter has been mounted on the plurality of pin receptors.

It will appreciated by a person familiar with the surface mount EMI suppression filters used in the preferred embodiment that the pin receptors 10 and 20 have been sized to accommodate two different sizes of pins. Specifically, as shown in FIG. 2, the NFM 51R-type filter has three pins which are all centered about the same axis and are, therefore, configured to be positioned within the pin receptors 10, 20 and 30 so that the pins are centered about the axis 50 (FIG. 1). The pins of the filter 25 are inset within a plastic casing 26 and only the end of a pin 120 and a pin 130 are shown in FIG. 2. The pins 110, 120 corresponding to the pin receptors 10 and 20 of the NFM 51R-type device are approximately 0.20–0.031 inches by 0.033 inches in the x and y directions denoted in FIG. 1 whereas the pin receptors 10 and 20 are 0.080 and 0.040 inches in the same x and y dimensions. Hence, the pin receptors 10 and 20 have a slightly greater y dimension than the pins 110 and 120 on the NFM 51R-type device and have a substantially greater x dimension than the corresponding dimension of the pin on the device 25. The dimensions of the pin 130 of the filter 25 are approximately the same as the dimensions of the pin receptor 30.

Figure 3:
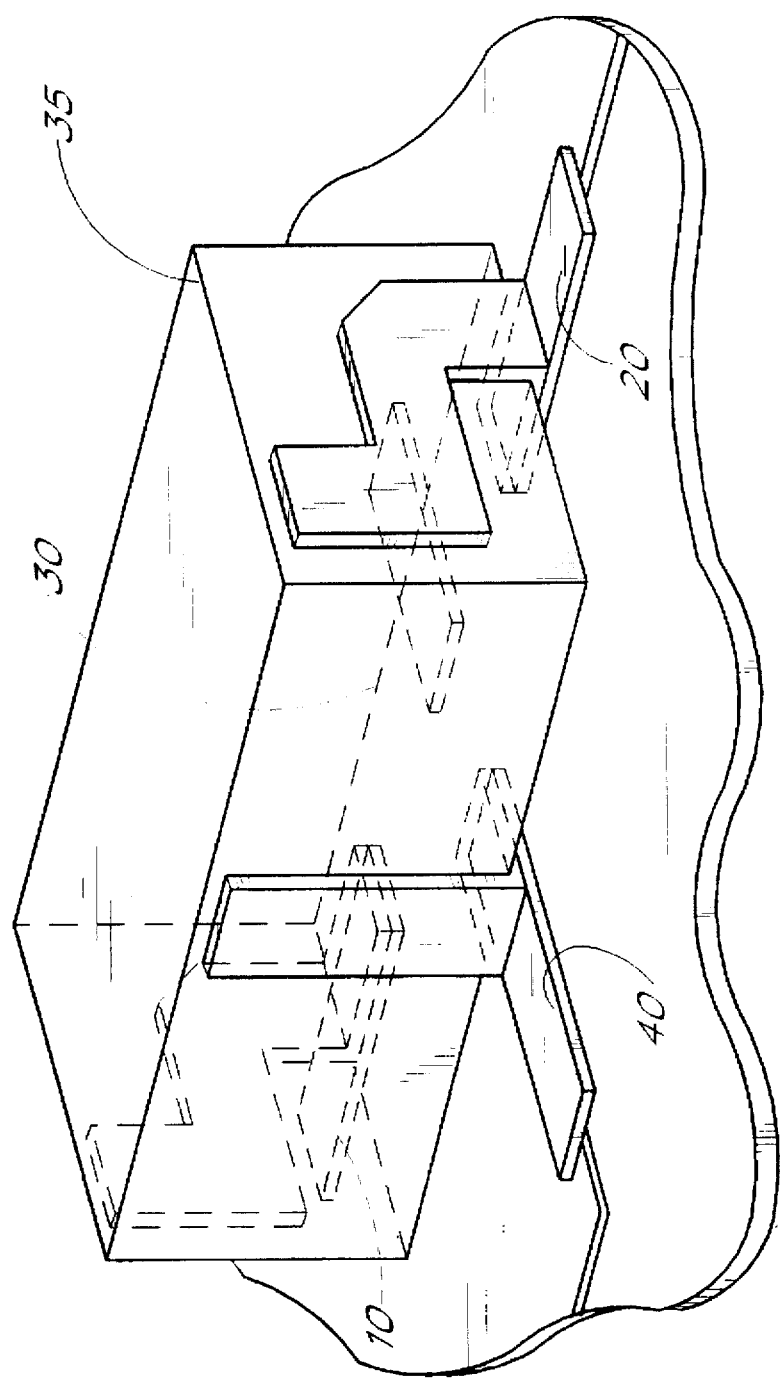
FIG. 3 is a perspective view of the printed circuit board portion of FIG. 1 wherein a second component package containing a SMD-type EMI filter has been positioned on the footprint.

However, the pins 210 and 220 on the ZJSM-type device 35 shown in FIG. 3 are spaced and are sized so as to require that the pin receptors 10 and 20 have larger dimensions than would otherwise be required to accommodate only the pins of the filter 25. Specifically, the pins 210, 220 on the ZJSM-type device 35 corresponding to the pin receptors 10 and 20 have approximate dimensions of 0.060 inches by 0.040 mils in the x and y directions and are spaced along an axis corresponding to the axis 50 in FIG. 1 so that the pins are approximately 0.094 inches apart. Hence, these dimensions of the pins on the two different devices dictate the position and size of the common pin receptors 10 and 20. The pin receptor 30 is positioned and sized so as to receive the center pin 130 on the NFM 51R-type device and the pin receptor 40 is configured and sized so as to receive the pin 240 on the ZJSM-type device.

In the preferred embodiment, the electronic circuit contained within the NFM 51R-type device 25 and the ZJSM-type device 35 have inputs and outputs that correspond to the pin receptors 10 and 20 and a ground that corresponds to the pin receptors 30 and 40. Hence, the preferred embodiment of the present invention describes a footprint that is capable of receiving two different types of device packages containing two EMI filters that perform a similar function but have a different configuration of pins. This is effectuated by configuring two of the pin receptors along a first axis so as to be capable of receiving at least two of the pins on either of the two different types of pin receptors and then positioning two other pin receptors along a perpendicular axis that are capable of receiving one pin from either of the devices. The footprint can therefore accommodate two different types of device packages while minimizing the amount of space on a printed circuit board that must be occupied by the footprint.

Although the foregoing description of the preferred embodiments of the present invention have shown, described and pointed out the fundamental novel features of the invention, it will be understood that various omissions, substitutions and changes in the form of the detail of the apparatus as illustrated, as well as the uses thereof, may be made by those skilled in the art without departing from the spirit of the present invention. Consequently, the scope of the invention should not be limited to the foregoing discussion, but should be defined by the appended claims.

What is claimed is:

1. A printed circuit board having a footprint for receiving one of a first type of electronic component and a second type of electronic component which have different pin configurations, said printed circuit board comprising:

a first common pin receptor formed on a first side of said printed circuit board and oriented about a first axis, wherein said first common pin receptor is configured to receive either a first pin of a first electronic a component of said first type of electronic component or a first pin of a second electronic component of said second type of electronic component;

a second common pin receptor formed on said first side of said printed circuit board and oriented about said first axis, wherein said second common pin receptor is configured to receive either a second pin of said first electronic component or a second pin of said second electronic component;

a third pin receptor formed on said first side of said printed circuit board between said first and second common pin receptors and oriented about said first axis, wherein said third pin receptor is configured to receive a third pin of said first electronic component when said first and second pins of said first electronic component are positioned within said first and second common pin receptors, and wherein said third pin receptor is also oriented about a second axis which is substantially orthogonal to said first axis; and a fourth pin receptor formed on said first side of said printed circuit board, wherein said fourth pin receptor is oriented about said second axis and is positioned so as to be spaced along said second axis from said third pin receptor, wherein said fourth pin receptor is configured to receive a third pin on said second electronic component when said first and second pins of said second electronic component are positioned within said first and second common pin receptors of said footprint.

2. The printed circuit board of claim 1, wherein said third and said fourth pin receptors are electrically connected.

3. The printed circuit board of claim 2, further comprising a conductive trace formed on said printed circuit board which electrically connects said third and said fourth pin receptors.

4. The printed circuit board of claim 1, wherein said first and second common pin receptors and said third pin receptor are configured to receive the pins of a first surface mount EMI suppression filter wherein said first EMI suppression filter has three pins that are oriented along an axis corresponding to said first axis of said printed circuit board.

5. The printed circuit board of claim 4, wherein said first and second common pin receptors and said fourth pin receptor are configured to receive the pins of a second surface mount EMI suppression filter, wherein said second EMI suppression filter has two pins oriented along said axis corresponding to said first axis of said printed circuit board and has a third pin that is oriented along an axis corresponding to said second axis of said printed circuit board.

6. A printed circuit board having a footprint for receiving one of two electronic components that have different pin configurations, said printed circuit board comprising:

a first common pin receptor formed on a first side of said printed circuit board and oriented about a first axis wherein said first common pin receptor is configured to receive either a first pin of a first electronic component or a first pin of a second electronic component;

a second common pin receptor formed on said first side of said printed circuit board and oriented about said first axis, wherein said second common pin receptor is configured to receive either a second pin of said first electronic component or a second pin of said second electronic component;

a third pin receptor formed on said first side of said printed circuit board between said first common pin receptor and said second common pin receptor and oriented about said first axis, wherein said third pin receptor is configured to receive a third pin of said first electronic component when said first and second pins of said first electronic component are positioned within said first and second common pin receptors, and wherein said third pin receptor is also oriented about a second axis which is substantially orthogonal to said first axis; and a fourth pin receptor formed on said first side of said printed circuit board wherein said fourth pin receptor is oriented about said second axis and is positioned so as to be spaced along said second axis from said third pin receptor wherein said fourth pin receptor is configured to receive a third pin on said second electronic component when said first and second pins of said second electronic component are positioned within said first and second common pin receptors of said footprint, wherein:

said first and second common pin receptors and said third pin receptor are configured to receive the pins of a first surface mount EMI suppression filter, wherein said first EMI suppression filter has three pins that are oriented along an axis corresponding to said first axis of said printed circuit board;

said first and second common pin receptors and said fourth pin receptor are configured to receive the pins of a second surface mount EMI suppression filter wherein said second surface mount EMI suppression filter has two pins oriented along said axis corresponding to said first axis of said printed circuit board and a third pin that is oriented along an axis corresponding to said second axis of said printed circuit board; and said first and second common pin receptors are substantially rectangular in configuration and have the approximate dimensions of 0.080 inches by 0.040 inches, wherein said third pin receptor is substantially rectangular in configuration and has the approximate dimensions of 0.080 inches by 0.040 inches, and wherein said fourth pin receptor is substantially rectangular in configuration and has the approximate dimensions of 0.060 inches by 0.040 inches.

7. The printed circuit board of claim 6, wherein said first and second common pin receptors extend longitudinally along said first axis and second third and fourth pin receptors extend longitudinally along said second axis.

8. The printed circuit board of claim 7, wherein said footprint extends 0.212 inches along said first axis and 0.145 inches along said second axis.

9. A printed circuit board having a footprint of pin receptors for receiving one of first and second types of surface mount EMI filters, each type of EMI filter having a respective arrangement of first, second and third pins, said printed circuit board comprising:

a first common pin receptor formed on a first side of said printed circuit board and oriented about a first axis, wherein said first common pin receptor is rectangular and extends longitudinally along a first axis and wherein said first common pin receptor is configured to receive either a first pin of a first EMI filter of said first type or a first pin of a second EMI filter of said second type;

a second common pin receptor formed on said first side of said printed circuit board and oriented about said first axis, wherein said second common pin receptor is rectangular and extends longitudinally along said first axis and wherein said second common pin receptor is configured to receiver either a second pin of said first EMI filter or a second pin of said second EMI filter;

a third pin receptor formed on said first side of said printed circuit board and oriented about said first axis between said first and second common pin receptors, wherein said third pin receptor is generally rectangular in configuration and extends longitudinally along a second axis that is orthogonal to said first axis, and wherein said third pin receptor is configured to receive said third pin of said first EMI filter when said first and second pins of said first EMI filter are positioned within said first and second common pin receptors; and a fourth pin receptor formed on said first side of said printed circuit board, wherein said fourth pin receptor is rectangular and extends longitudinally along said second axis and is positioned so as to be spaced from said third pin receptor, and wherein said fourth pin receptor is configured to receive said third pin of said second EMI filter when said first and second pins of said second EMI filter are positioned within said first and second common pin receptors.

10. The printed circuit board of claim 9, further comprising a conductive trace formed on said printed circuit board which electrically connects said third and said fourth pin receptors.

11. The printed circuit board of claim 10, wherein said first and second common pin receptors have the approximate dimensions of 0.080 inches by 0.040 inches, wherein said third pin receptor has the approximate dimensions of 0.080 inches by 0.040 inches, and wherein said fourth pin receptor has the approximate dimensions of 0.060 inches by 0.040 inches.

12. The printed circuit board of claim 11, wherein said footprint extends 0.212 inches along said first axis and 0.145 inches along said second axis.

13. A method of producing a printed circuit board which receives one of first and second types of electronic components which perform a comparable function in a single footprint formed in said printed circuit board and which have respective first and second pin configurations, said method comprising the steps of:

forming on a first side of said printed circuit board a first common pin receptor so that said first common pin receptor is oriented about a first axis, wherein said first common pin receptor is configured to receive either a first pin of a first electronic component of said first type of electronic component having said first pin configuration or a first pin of a second electronic component of said second type of electronic component having said second pin configuration;

forming on said first side of said printed circuit board a second common pin receptor oriented along said first axis, wherein said second common pin receptor is configured to receive either a second pin of said first electronic component or a second pin of said second electronic component;

forming on said first side of said printed circuit board a third pin receptor positioned between said first and second common pin receptors and oriented about said first axis, wherein said third pin receptor is configured to receive a third pin of said first electronic component when said first and second pins of said first electronic component are positioned within said first and second common pin receptors, and wherein said third pin receptor is also oriented about a second axis which is substantially orthogonal to said first axis;

forming on said first side of said printed circuit board a fourth pin receptor oriented about said second axis and positioned apart from said third pin receptor, wherein said fourth pin receptor is configured to receive a third pin of said second electronic component when said first and second pins of said second electronic component are positioned within said first and second common pin receptors; and if said first electronic component of said first type of electronic component rather than said second electronic component of said second type of electronic component is to be installed on said printed circuit board positioning said first electronic component in said footprint of said printed circuit board with said pins of said first electronic component secured to said first, second and third pin receptors; and if said second electronic component of said second type of electronic component rather than said first electronic component of said first type of electronic component is to be installed on said printed circuit board, positioning said second electronic component in said footprint of said printed circuit board with said pins of said second electronic component secured to said first, second and fourth pin receptors.

14. The method of claim 13, further comprising the step of electrically connecting said third and said fourth pin receptors formed on said plurality of printed circuit boards.

15. The method of claim 13, wherein the step of forming said first common pin receptor comprises forming a substantially rectangular pin receptor that has the approximate dimensions of 0.080 mils by 0.040 mils, wherein the step of forming said second common pin receptor comprises forming a substantially rectangular pin receptor that has the approximate dimensions of 0.080 mils by 0.040 mils, wherein the step of forming said third pin receptor comprises forming a substantially rectangular pin receptor that has the approximate dimensions of 0.080 mils by 0.949 mils and wherein the step of forming said fourth pin receptor comprises forming a substantially rectangular pin receptor that has the approximate dimensions of 0.060 mils by 0.040 mils.

16. A printed circuit board having a footprint for receiving one of a first type of electronic component and a second type of electronic component, wherein said first and second types of electronic components have respective first and second pin configurations, said printed circuit board comprising:

a first set of pin receptors positioned in a predetermined area on said printed circuit board configured to accommodate a first component of said first type of electronic component, said first pin configuration matching said first set of pin receptors, and a second set of pin receptors in said predetermined area configured to accommodate a second component of said second type of electronic component, said second pin configuration matching said second set of pin receptors said second set of pin receptors having at least one pin receptor not in said first set of pin receptors such that said second type of electronic component can only be accommodated by said second set of pin receptors, said first set of pin receptors having at least one pin receptor not in said second set of pin receptors such that said first type of electronic component can only be accommodated by said first set of pin receptors, and said first and second sets of pin receptors having at least one common pin receptor.

17. A printed circuit board having a footprint for receiving one of two electronic components that have different pin configurations, said printed circuit board comprising:

a first set of pin receptors positioned in a predetermined area on said printed circuit board configured to accommodate a first component; and a second set of pin receptors in said predetermined area configured to accommodate a second component, said second set of pin receptors having at least one pin receptor not in said first set of pin receptors, said first set of pin receptors having at least one pin receptor not in said second set of pin receptors, and said first and second sets of pin receptors having at least one common pin receptor wherein said first set of pin receptors and said second set of pin receptors include first and second common pin receptors which are in both said first set of pin receptors and said second set of pin receptors.

18. The printed circuit board of claim 21, wherein said first set of pin receptors includes a third pin receptor and wherein said second set of pin receptors includes a fourth pin receptor.

19. The printed circuit board of claim 21, further comprising a conductive trace interconnecting said third and said fourth pin receptors.

20. The printed circuit board of claim 19, wherein said first and second common pin receptors and said third pin receptors are positioned along a first axis, with said third pin receptor interposed between said first and second common pin receptors, said first, second and third pin receptors configured to receive said first component, wherein said first component has three pins that are mounted along a second axis corresponding to said first axis.

21. The printed circuit board of claim 20, wherein said second set of pin receptors comprises said first common pin receptor, said second common pin receptor and said fourth pin receptor, wherein said fourth pin receptor is spaced from said third pin receptor, and wherein said second component has three pins with two pins spaced along a third axis corresponding to said first axis and has a third pin spaced from said third axis.

22. The printed circuit board of claim 20, wherein said first and second common pin receptors are offset in said first axis so that farthest edges thereof are 0.212 inches apart, and wherein said third and fourth receptors are offset in said second axis so that farthest edges thereof are 0.145 inches apart.

23. The printed circuit board of claim 10, wherein said first and second common pin receptors are offset in said first axis so that farthest edges thereof are 0.212 inches apart, and wherein said third and fourth receptors are offset in said second axis so that farthest edges thereof are 0.145 inches apart.

24. The printed circuit board of claim 5, wherein said first and second common pin receptors are offset in said first axis so that farthest edges thereof are 0.212 inches apart, and wherein said third and fourth receptors are offset in said second axis so that farthest edges thereof are 0.145 inches apart.

* * * * *

UNITED STATES PATENT AND TRADEMARK OFFICE
CERTIFICATE OF CORRECTION

PATENT NO.   : 5,764,488
DATED        : June 9, 1998
INVENTOR(S)  : David J. Silva, et al.

It is certified that error appears in the above-identified patent and that said Letters Patent is hereby corrected as shown below:

Column 6,
Line 59, change "receiver" to -- receive. --

Signed and Sealed this

Sixth Day of November, 2001

*Attest:*

*Attesting Officer*

NICHOLAS P. GODICI
*Acting Director of the United States Patent and Trademark Office*